United States Patent
Woo et al.

(10) Patent No.: US 6,780,709 B2
(45) Date of Patent: Aug. 24, 2004

(54) METHOD FOR FORMING CHARGE STORAGE NODE

(75) Inventors: Sang-ho Woo, Icheon-shi (KR); Eui-sik Kim, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/326,649

(22) Filed: Dec. 19, 2002

(65) Prior Publication Data

US 2003/0180995 A1 Sep. 25, 2003

(30) Foreign Application Priority Data

Dec. 21, 2001 (KR) .................................. 10-2001-0082789

(51) Int. Cl.[7] .......................................... H01L 21/8242
(52) U.S. Cl. ...................... 438/253; 438/254; 438/637; 438/700
(58) Field of Search ................................. 438/253–259, 438/396–397, 637–639, 700

(56) References Cited

U.S. PATENT DOCUMENTS

| | | | |
|---|---|---|---|
| 5,766,993 A | 6/1998 | Tseng | 438/253 |
| 5,907,772 A | 5/1999 | Iwasaki | 438/253 |
| 5,953,609 A * | 9/1999 | Koyama et al. | 438/253 |
| 6,087,212 A | 7/2000 | Hirota | 438/238 |

* cited by examiner

Primary Examiner—Dung A. Le
(74) Attorney, Agent, or Firm—Marshall, Gerstein & Borun LLP

(57) ABSTRACT

A method for forming a charge storage node is disclosed. The method for forming a charge storage node prevents the bridge between cells and maximize the hole size of a cell forming portion to thus improve the properties of a device and increase product yield by depositing an oxide film having a predetermined thickness and forming a contact hole in order to fill the hole of a notch type generated by the etching difference between a damaged sacrificial oxide film and an oxide film for capacitor formation deposited thereon after enlarging the hole size by washing and dipping processes before the formation of the charge storage node.

7 Claims, 10 Drawing Sheets

METHOD FOR FORMING CHARGE STORAGE NODE

BACKGROUND

1. Technical Field

Methods for forming charge storage nodes are disclosed, and more particularly, methods for forming charge storage nodes which prevent the bridge between cells and maximize the hole size of a cell forming portion to thus improve the properties of the devices and increase product yield by depositing an oxide film having a predetermined thickness and forming a contact hole in order to fill the hole of a notch type generated by the etching difference between a damaged sacrificial oxide film and an oxide film for capacitor formation deposited thereon after enlarging the hole size by washing and dipping processes before the formation of the charge storage node.

2. Description of the Related Art

Recently, with high integration of semiconductor devices, semiconductor memory devices such as a DRAMs (Dynamic Random Access Memory) demand a capacitance larger than a predetermined capacity to obtain the desired operational characteristics. Also, with high integration, as the area per unit cell decreases, the devices must occupy a smaller surface area while securing a large capacitance.

FIG. 1 is a photograph showing the problem of a charge storage node according to the conventional art.

In a conventional method of forming a charge storage node (not shown), first, a predetermined substructure is formed on a semiconductor substrate. A planarization process is carried out to form a charge storage node. An etching stop film and sacrificial oxide film of a predetermined thickness are formed sequentially. Next, a first contact hole is formed on the portion in which the charge storage node is to be formed by masking and etching processes.

Next, to fill the first contact hole, a doped amorphous silicon film or a polycrystalline silicon film is deposited. Then, second contact hole is formed by etching the front surface, and an oxide film having a predetermined height is deposited. Subsequently, the portion in which the charge storage node is to be formed is patterned by masking and etching processes. Thereafter, a washing process is performed to form the charge storage node.

However, such a conventional method of forming a charge storage node has some defects. As illustrated in FIG. 1, the sacrificial oxide film on the upper portion of the etching stop film is damaged in the etchback process of the polysilicon film. Hence, a notch type hole is formed by an etching difference between the sacrificial oxide film and the polysilicon film. This generates a bridge between cells which deteriorates the operational characteristics of the device and causes a reduction in product yield.

SUMMARY OF THE DISCLOSURE

Therefore, a method is disclosed for forming a charge storage node which prevents the bridge between cells and maximizes the hole size of a cell forming portion to thus improve the properties of a device. The disclosed method also increases product yield by depositing an oxide film having a predetermined thickness and forming a contact hole in order to fill the hole of a notch type generated by the etching difference between a damaged sacrificial oxide film and an oxide film for capacitor formation deposited thereon after enlarging the hole size by washing and dipping processes before the formation of the charge storage node.

A disclosed method for forming a charge storage node comprises: carrying out a planarization process for forming a charge storage node on a substrate in which a predetermined substructure is formed and then depositing an etching stop layer and a sacrificial oxide film in order; forming a first contact hole on the resultant material by masking and etching processes; depositing doped amorphous silicon to fill the first contact hole for the charge storage node; forming a second contact hole on the doped amorphous silicon film by an etchback process and then performing a washing process; dipping the second contact hole in a wet etching solution for oxidation for a predetermined time after the washing process; forming an oxide film having a predetermined thickness on the resultant material in which the second contact hole is formed and then opening the first contact hole at the lower portion by performing the etchback process; depositing a polysilicion film having a predetermined thickness on the resultant material in which the first contact hole is opened and then depositing a photoresist at a predetermined thickness; etching the upper portion of the polysilicon film by the etchback process using the photoresist; and removing the photoresist and forming a meta-stable polysilicon film.

Preferably, the washing process is performed using a clean B solution ($H_2SO_4+H_2O=4:1$) to remove organic substances, a SC-1 solution (aqueous solution of $NH_4OH$ and $H_2O_2$) to remove particles and impurities and a HF (hydrofluoric acid) or BOE (buffered oxide etch) solution to prevent the generation of a natural oxide film. The polysilicon film is formed at a thickness ranging from about 100 to about 2000 Å at a pressure ranging from 0.1 to about 300 torr at a temperature ranging from about 450 to about 560° C. using one of gases selected from $SiH_4$, $Si_2H_6$, $SiH_2Cl_2$ and $PH_3$ gases.

Preferably, the oxide film forms one of film selected from a HTO (high temperature oxide) film, a LTO (low temperature oxide) film, a PE-TEOS (plasma enhanced tetra ethyl ortho silicate) film, and a LP-TEOS (low pressure tetra ethyl ortho silicate) film. The oxide film is preferably formed by the CVD (chemical vapor deposition) method.

Preferably, the dipping process using the wet etching solution for oxidation is performed for a time period ranging from about 5 to about 300 seconds using the BOE solution with the ratio of about 300:1. The meta-stable polysilicon (MPS) film is formed to a range of about 1.1 to about 2.6 times larger than the polysilicon film.

BRIEF DESCRIPTION OF THE DRAWINGS

The above features and advantages of the disclosed methods will become more apparent from the following detailed description when taken in conjunction with the accompanying drawings, wherein.

DETAILED DESCRIPTION OF THE PRESENTLY PREFERRED EMBODIMENTS

A preferred embodiment will now be described with reference to the accompanying drawings. The preferred embodiment is intended to illustrate the principles of the disclosed methodology, but not to limit the scope of this disclosure.

FIGS. 2a to 2i are cross-sectional views showing a process of forming a charge storage node according to a preferred embodiment.

Figure 1:
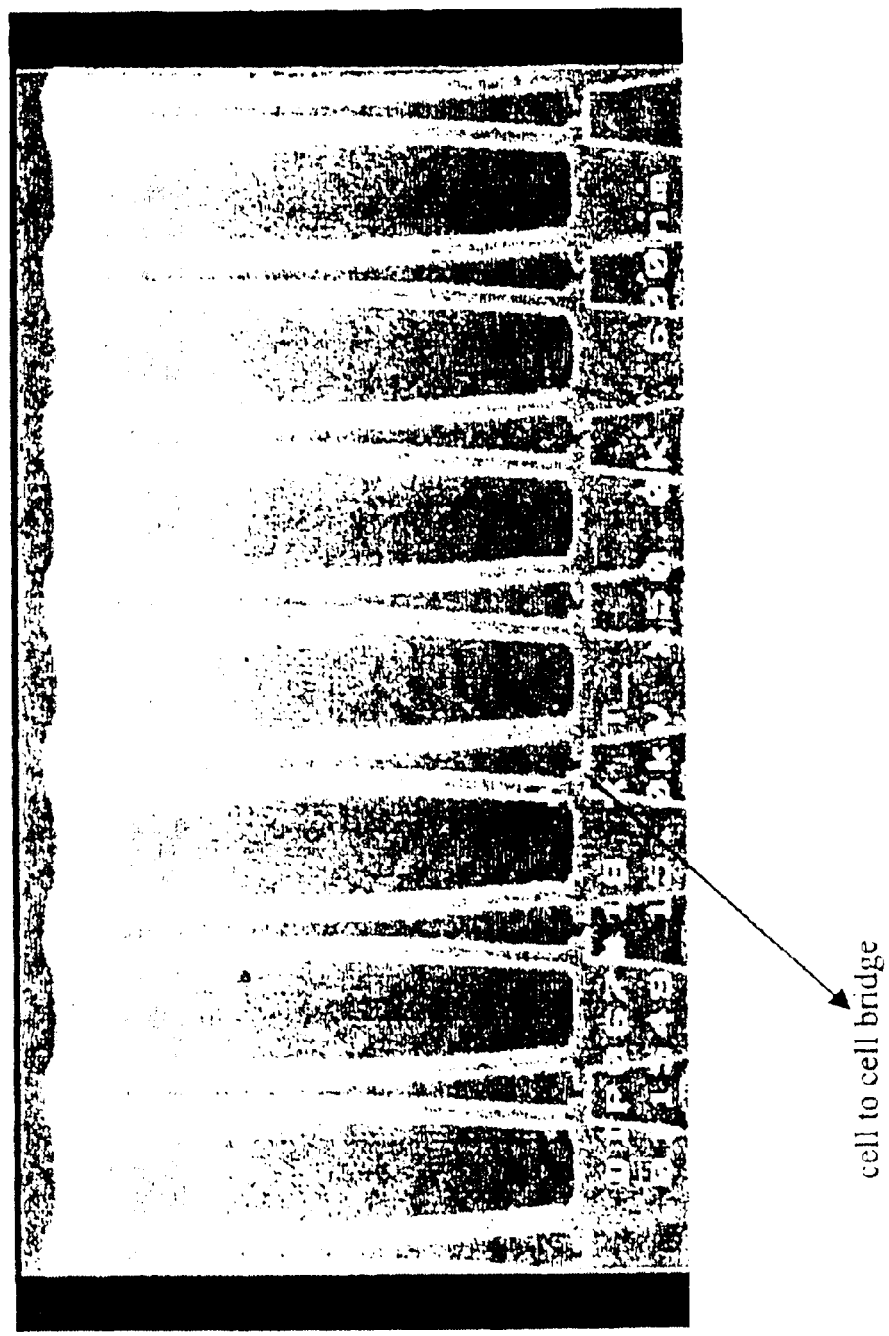
FIG. 1 is a photograph showing the problem of a charge storage node according to the conventional art.
Figure 2A:
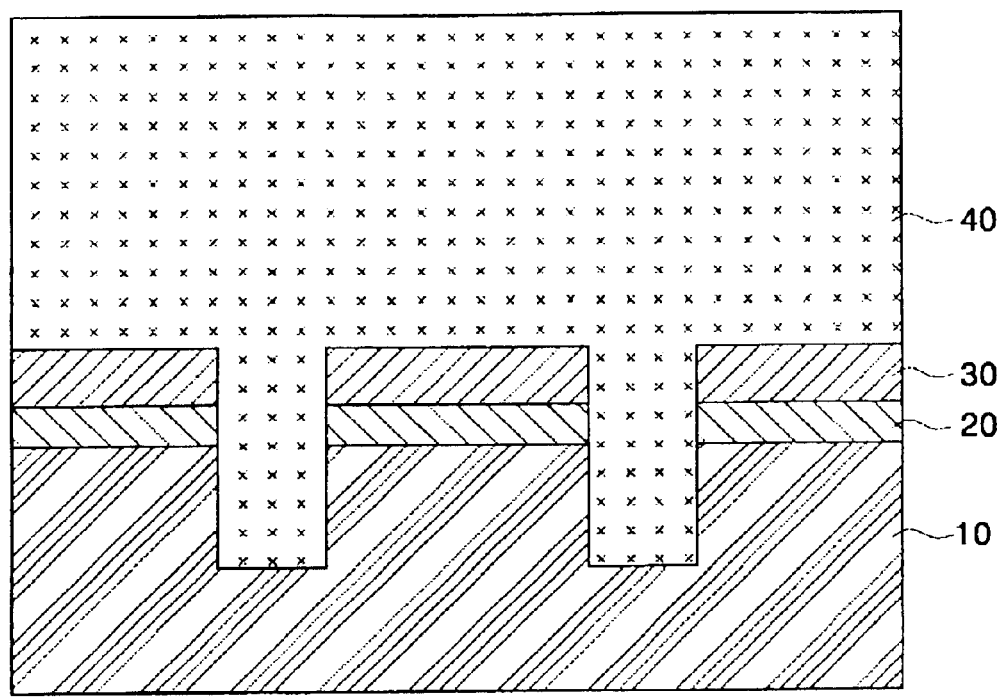
FIGS. 2a to 2i are cross-sectional views showing the process of forming a charge storage node according to the disclosed methods.

Firstly, as illustrated in FIG. 2a, a planarization process is performed to form a charge storage node on a substrate 10 in which a predetermined substructure is formed. Then, an etching stop film 20 and a sacrificial oxide film 30 are deposited in order. Subsequently, a first contact hole (not shown) for the charge storage node is formed by masking and etching processes.

Next, doped amorphous silicon 40 is deposited to fill the first contact hole (not shown) for the charge storage node.

Figure 2B:
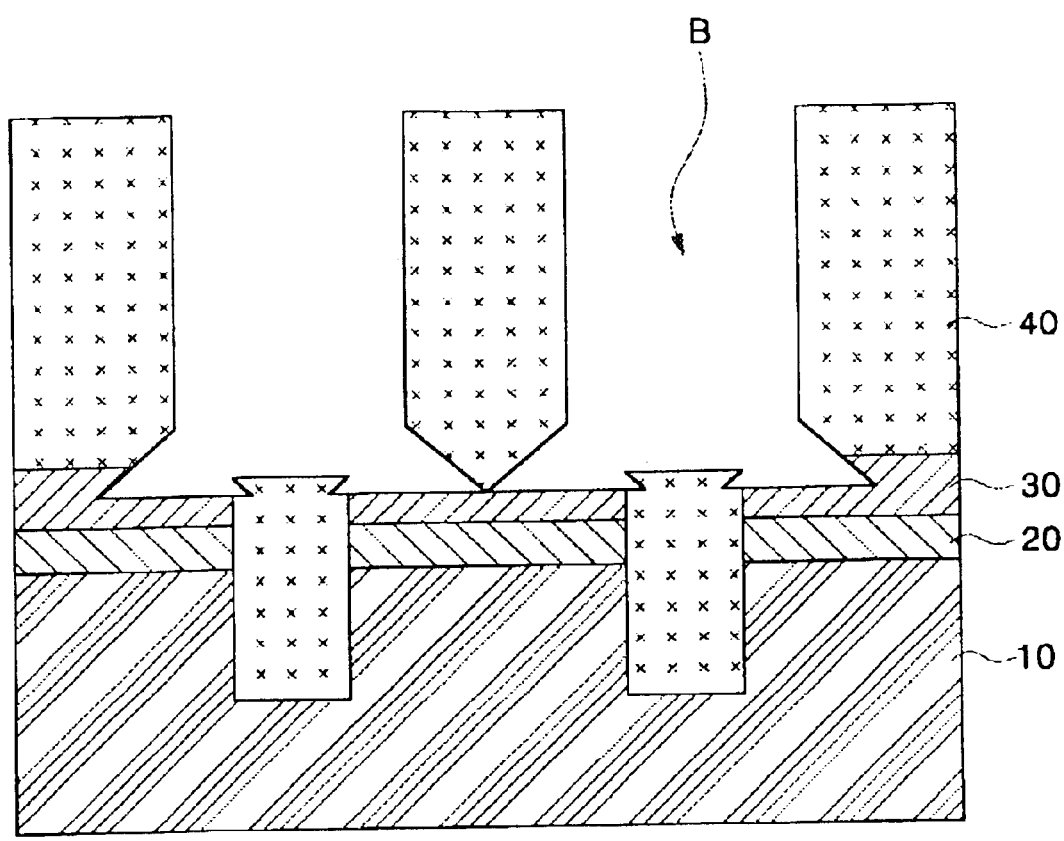

Subsequently, as illustrated in FIG. 2b, a second contact hole (B) is formed by an etchback process, and then a washing process is performed thereon.

At this time, the second contact hole (B) is washed in a clean B solution ($H_2SO_4+H_2O=4:1$) to remove organic substances, a SC-1 solution to remove particles and impurities, and a HF or BOE solution to prevent the generation of a natural oxide film. Then, it is dipped in a wet etching solution for a predetermined time to maximize the size of the second contact hole B.

At this time, the dipping process is performed for 5 to 300 seconds using the BOE solution at the ratio of 3:1.

Figure 2C:
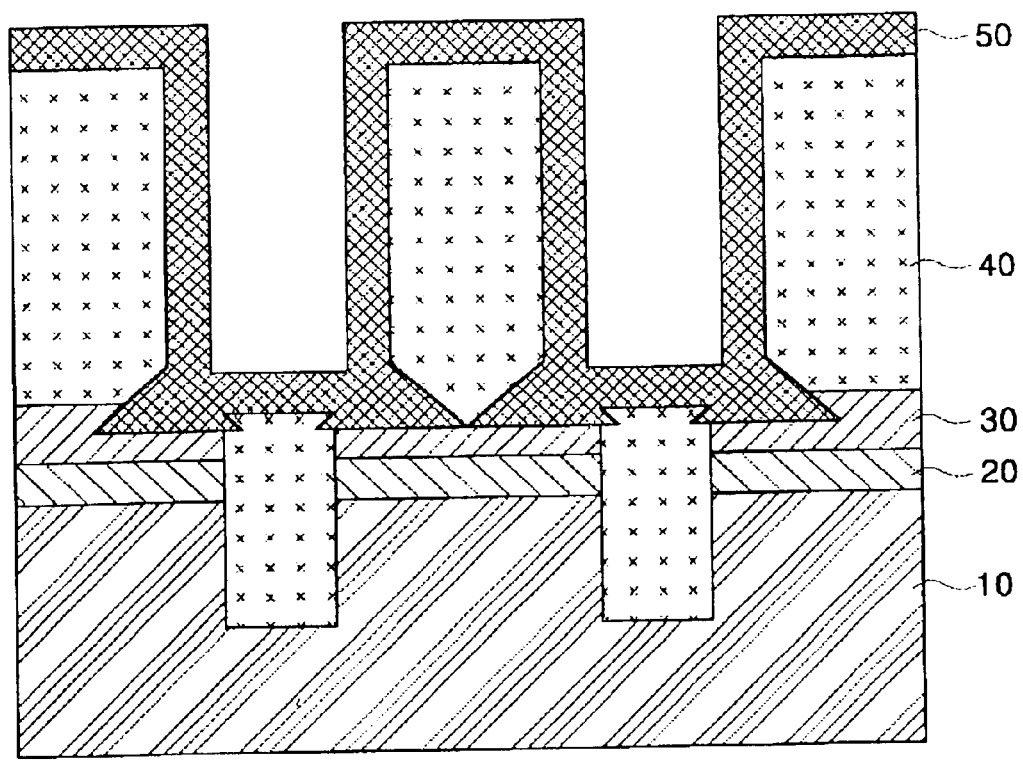
Figure 2D:
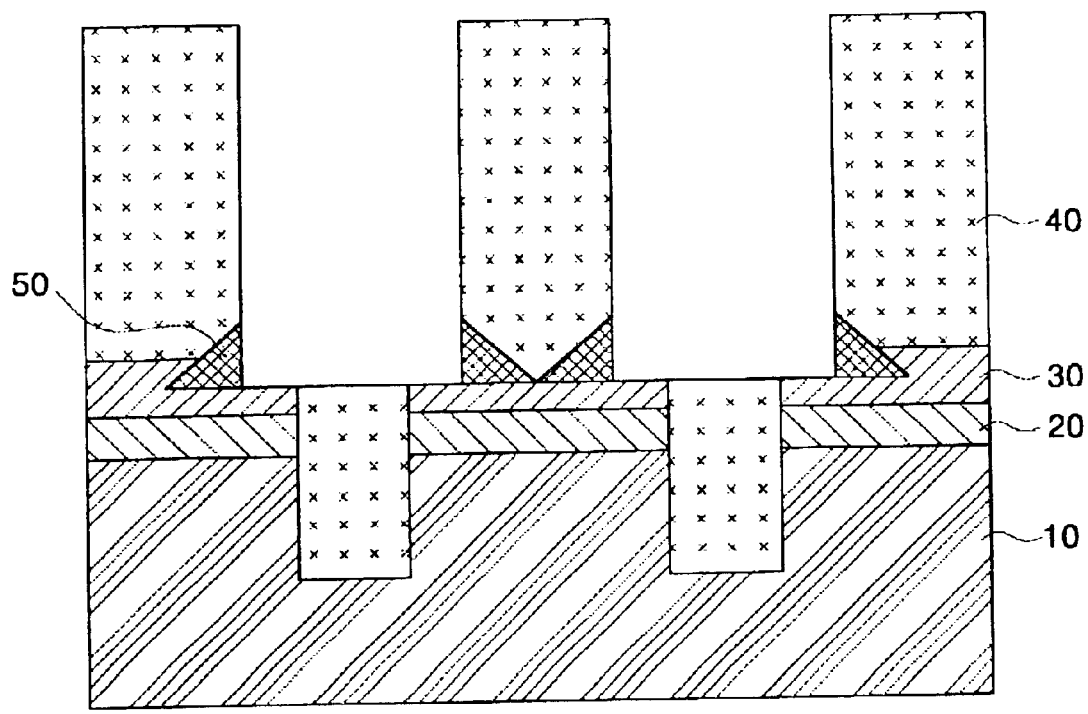
Figure 2E:
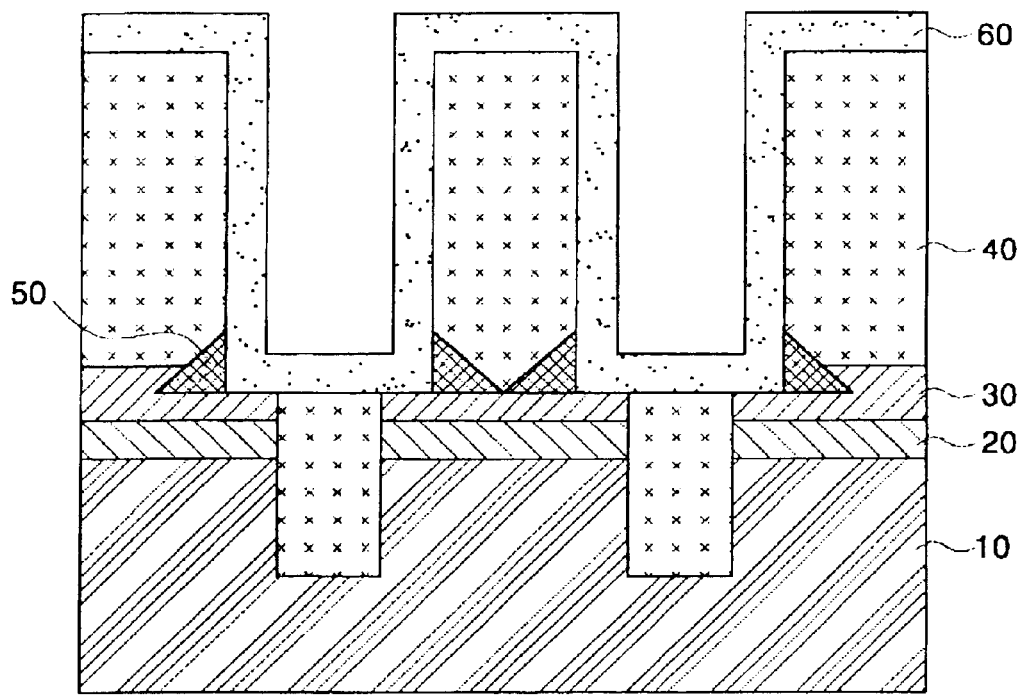
Figure 2F:
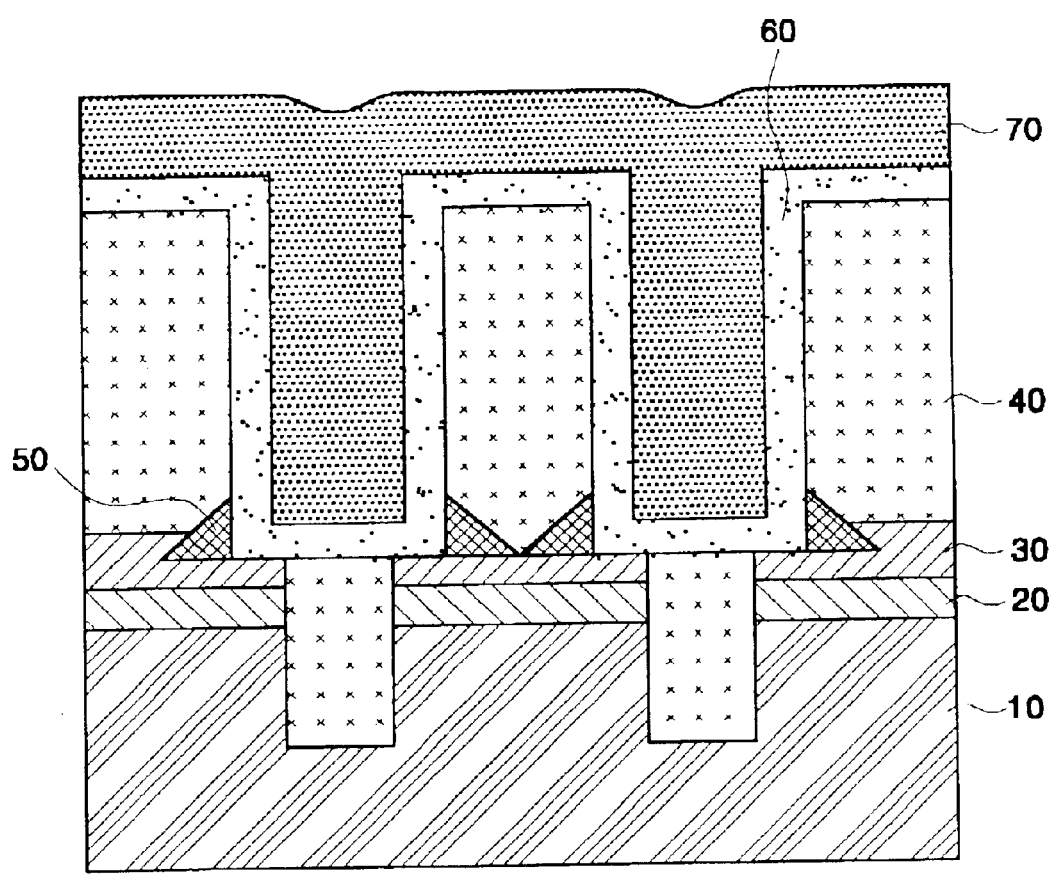
Figure 2G:
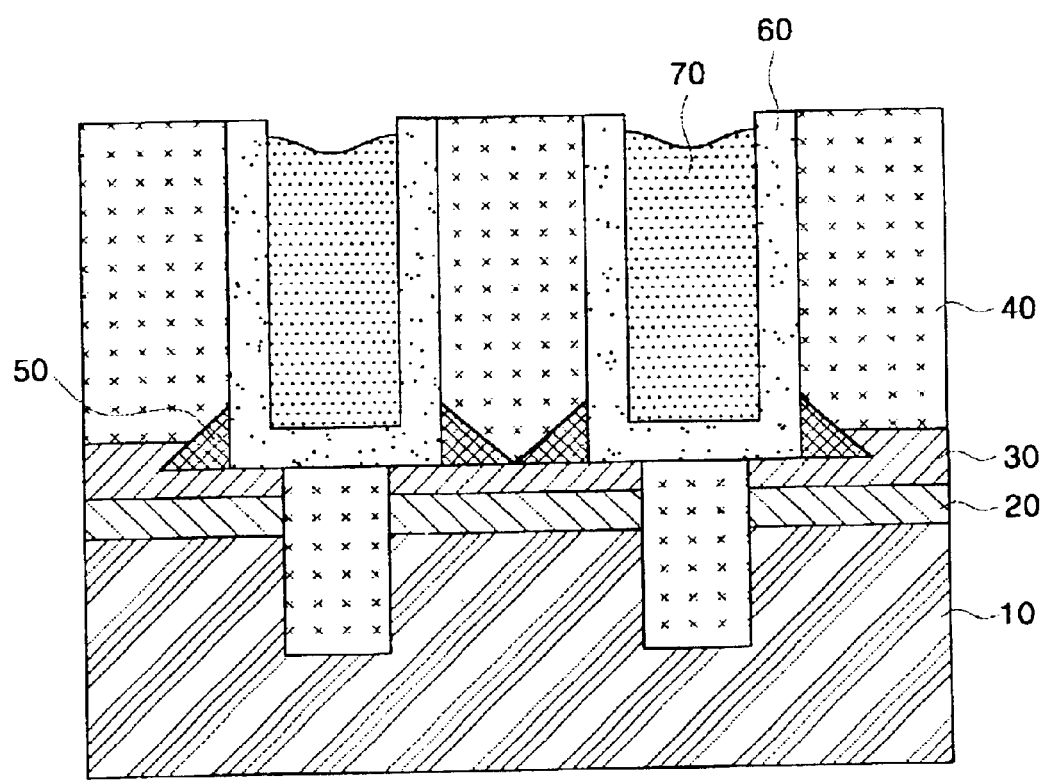

As illustrated in FIG. 2c, an oxide film 50 having a predetermined thickness is formed to fill the notch type hole generated on a lower side wall during the washing process due to an etching difference between the oxide film at a damaged portion and the oxide film at a non-damaged portion. Then, as illustrated in FIG. 2d, the first contact hole (not shown) at the lower portion is opened by performing the etchback process.

At this time, the oxide film 50 is formed from one of the films selected from a HTO (High Temperature Oxide) film, a LTO (Low Temperature Oxide) film, a PE-TEOS (plasma Enhanced-Tetra Ethyl Ortho Sillicate) film, or a LP-TEOS (Low Pressure-Tetra Ethyl Ortho Sillicate) film.

At this time, the polysilicon film 60 is formed at a thickness ranging from about 100 to about 2000 Å at a pressure ranging from 0.1 to about 300 torr at a temperature ranging from about 450 to about 560° C. using one gas selected from SiH4, Si2H6, SiH2Cl2 or PH3 gases.

Figure 2H:
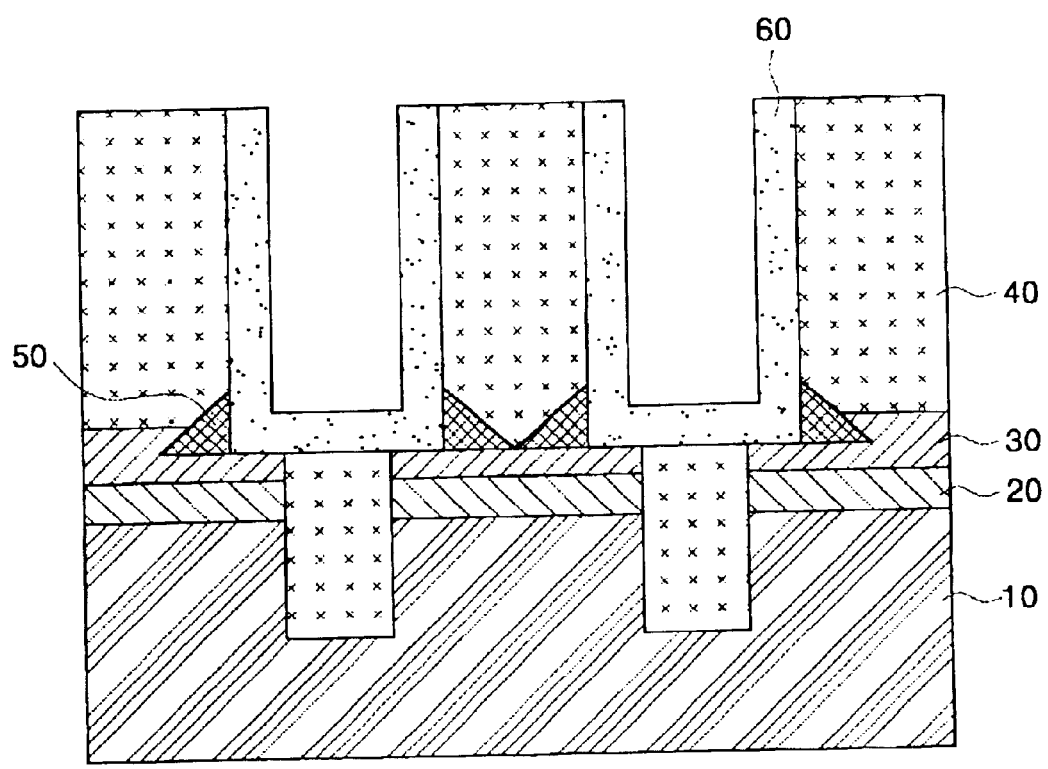
Figure 2I:
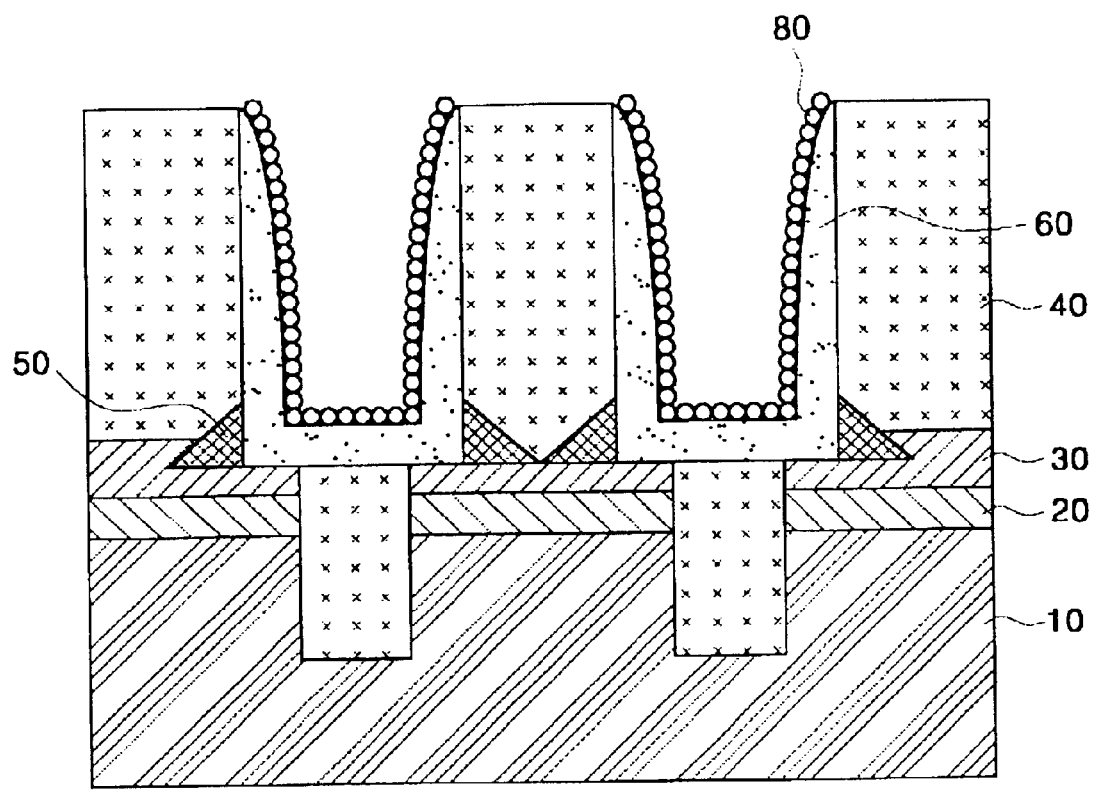

Subsequently, as illustrated in FIG. 2h, the profile of the charge storage node is made by removing the photoresist 70. Then, as illustrated in FIG. 2i, a meta-stable polysilicon (MPS) 80 is formed from about 1.1 to about 2.6 times larger than the polysilicon film 60 to increase the capacitance of the storage node.

As explained above, the disclosed method can prevent the bridge between cells and can maximize the hole size of a cell forming portion to thus improve the properties of a device and increase product yield by depositing an oxide film having a predetermined thickness and forming a contact hole in order to fill the hole of a notch type generated by the etching difference between a damaged sacrificial oxide film and an oxide film for capacitor formation deposited thereon after enlarging the hole size by washing and dipping processes before the formation of the charge storage node.

What is claimed is:

1. A method for forming a charge storage node, the method comprising:

carrying out a planarization process for forming a charge storage node on a substrate and then sequentially depositing an etching stop layer and a sacrificial oxide film;

forming a first contact hole in the sacrificial oxide film and etching stop layer by masking and etching processes;

depositing doped amorphous silicon to fill the first contact hole for the charge storage node;

forming a second contact hole on the doped amorphous silicon film by an etchback process and then performing a washing process;

dipping the second contact hole in a wet etching solution for oxidation after the washing process;

forming an oxide film on the resultant material in which the second contact hole is formed and then opening the first contact hole at the lower portion by performing the etchback process;

depositing a polysilicon film on the resultant material in which the first contact hole is opened and then depositing a photoresist;

etching the upper portion of the polysilicon film by the etchback process using the photoresist to prevent etching of the polysilicon film disposed in the contact hole; and removing the photoresist and forming a meta-stable polysilicon film.

2. The method of claim 1, wherein the washing process is performed using a cleaning solution comprising $H_2SO_4$ and $H_2O$ in a ratio or about 4:1 to remove organic substances, an aqueous solution of $NH_4O_4$ and $H_2O_2$ to remove particles and impurities and a HF or buffered oxide etching solution to prevent the generation of a natural oxide film.

3. The method of claim 1, wherein the polysilicon film is formed at a thickness ranging from about 100 to about 2000 Å at a pressure ranging from 0.1 to about 300 torr at a temperature ranging from about 450 to about 560° C. using gases selected from the group consisting of $SiH_4$, $Si_2H_6$, $SiH_2Cl_2$ or $PH_3$.

4. The method of claim 1, wherein the oxide film is formed from films selected from the group consisting of a high temperature oxide film, a low temperature oxide film, a plasma enhanced tetra ethyl ortho silicate film, and a low pressure tetra ethyl ortho silicate film.

5. The method of claim 4, wherein the oxide film is formed by a chemical vapor deposition method.

6. The method of claim 1, wherein the dipping process using the wet etching solution for oxidation is performed for a time period ranging from about 5 to about 300 seconds using a buffered oxide etching solution.

7. The method of claim 1, wherein the meta-stable polysilicon (MPS) film is formed to about 1.1 to 2.6 times thicker than the polysilicon film.

* * * * *

UNITED STATES PATENT AND TRADEMARK OFFICE
CERTIFICATE OF CORRECTION

PATENT NO.        : 6,780,709 B2                                         Page 1 of 1
APPLICATION NO. : 10/326649
DATED             : August 24, 2004
INVENTOR(S)       : Woo et al.

It is certified that error appears in the above-identified patent and that said Letters Patent is hereby corrected as shown below:

Title Page
Column 1
Field (75): Inventor

After "Sang-ho Woo," please delete "Icheon-shi"
and insert -- Kyunggi-do -- in its place.

Claim 1
Column 4
Line 29

After "of the polysilicon film disposed"
please delete "in the contact hole"
and insert -- in the second contact hole -- in its place.

Signed and Sealed this

Twenty-ninth Day of May, 2007

JON W. DUDAS
*Director of the United States Patent and Trademark Office*